United States Patent
Johnson et al.

(10) Patent No.: US 10,247,951 B2
(45) Date of Patent: Apr. 2, 2019

(54) TRANSPARENT DISPLAY

(71) Applicant: KONINKLIJKE PHILIPS N.V., Eindhoven (NL)

(72) Inventors: Mark Thomas Johnson, Arendonk (BE); Bart Kroon, Eindhoven (NL); Elbert Gerjan Van Putten, 's-Hertogenbosch (NL); Olexandr Valentynovych Vdovin, Maarheeze (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 672 days.

(21) Appl. No.: 14/772,418

(22) PCT Filed: Mar. 11, 2014

(86) PCT No.: PCT/IB2014/059611
§ 371 (c)(1),
(2) Date: Sep. 3, 2015

(87) PCT Pub. No.: WO2014/141053
PCT Pub. Date: Sep. 18, 2014

(65) Prior Publication Data
US 2016/0025991 A1    Jan. 28, 2016

Related U.S. Application Data

(60) Provisional application No. 61/775,783, filed on Mar. 11, 2013.

(51) Int. Cl.
G02B 27/26 (2006.01)
H04N 13/305 (2018.01)
(Continued)

(52) U.S. Cl.
CPC .......... *G02B 27/26* (2013.01); *G02B 5/3058* (2013.01); *G02B 5/3083* (2013.01);
(Continued)

(58) Field of Classification Search
CPC .. G02B 27/26; G02B 27/2214; G02B 5/3058; H04N 13/0452; H04N 13/0456;
(Continued)

(56) References Cited

U.S. PATENT DOCUMENTS

| 7,978,407 B1* | 7/2011 | Connor | H04N 13/32 359/463 |
| 2008/0204874 A1* | 8/2008 | Kim | G02B 27/2214 359/465 |

(Continued)

FOREIGN PATENT DOCUMENTS

| EP | 1478033 A2 | 11/2004 |
| EP | 1950980 A1 | 7/2008 |

(Continued)

OTHER PUBLICATIONS

Dong Liang, Jiang Luo, Wu-Xiang Zhao, Da-Hai Li, and Qiong-Hua Wang, "2D/3D Switchable Autostereoscopic Display Based on Polymer-Stabilized Blue-Phase Liquid Crystal Lens," Journal of Display Technology, vol. 8, issue 10, 2012, pp. 609-612.

*Primary Examiner* — Shawn S An (57) ABSTRACT

A display has an array of light emitting display pixels occupying pixel areas, and a polarizing light transmissive area between the pixel areas. This polarization can be used to improve the contrast ratio of a transparent 2D display. However, it can also be used to enable a transparent 3D display to be formed without distortion of the see-through transparent display function. For this purpose, the light emitting display pixels can emit polarized light orthogonal to the polarization provided by the light transmissive area.

18 Claims, 5 Drawing Sheets

(51) Int. Cl.
*H04N 13/356* (2018.01)
*H04N 13/361* (2018.01)
*G02B 5/30* (2006.01)
*G02B 27/22* (2018.01)
*H01L 51/52* (2006.01)
*H01L 27/32* (2006.01)

(52) U.S. Cl.
CPC ........ *G02B 27/2214* (2013.01); *H01L 27/326* (2013.01); *H01L 27/3234* (2013.01); *H01L 51/5275* (2013.01); *H01L 51/5281* (2013.01); *H04N 13/305* (2018.05); *H04N 13/356* (2018.05); *H04N 13/361* (2018.05); *H01L 2251/5323* (2013.01)

(58) Field of Classification Search
CPC ............ H04N 13/0404; H01L 27/3234; H01L 27/326; H01L 51/5281; H01L 51/5275
See application file for complete search history.

(56) References Cited

U.S. PATENT DOCUMENTS

| | | | |
|---|---|---|---|
| 2009/0147185 A1 | 6/2009 | Quach | |
| 2011/0050550 A1* | 3/2011 | Tsai | G09G 3/3233 345/76 |
| 2011/0122329 A1* | 5/2011 | Broughton | G02B 27/2214 349/15 |
| 2011/0273636 A1 | 11/2011 | Schultz et al. | |
| 2012/0008203 A1 | 1/2012 | Ijzerman et al. | |
| 2012/0139903 A1 | 6/2012 | Rush et al. | |
| 2012/0139905 A1* | 6/2012 | Hwang | H04N 13/398 345/419 |
| 2012/0176298 A1* | 7/2012 | Suh | H01L 27/3234 345/82 |
| 2013/0050611 A1* | 2/2013 | Parry-Jones | G02F 1/133512 349/62 |
| 2013/0194528 A1* | 8/2013 | Wang | G02F 1/13306 349/43 |
| 2015/0293369 A1* | 10/2015 | Van Putten | G02B 27/26 359/463 |

FOREIGN PATENT DOCUMENTS

| | | | |
|---|---|---|---|
| JP | 2004144800 A | 5/2004 | |
| WO | 03015424 A2 | 2/2003 | |
| WO | 2007072289 A2 | 6/2007 | |
| WO | WO-2012101397 A2 * | 8/2012 | ............ G09G 3/003 |

* cited by examiner

TRANSPARENT DISPLAY

CROSS-REFERENCE TO PRIOR APPLICATIONS

This application is the U.S. National Phase application under 35 U.S.C. § 371 of International Application No. PCT/IB2014/059611, filed on Mar. 11, 2014, which claims the benefit of U.S. Provisional Patent Application No. 61/775,783, filed on Mar. 11, 2013. These applications are hereby incorporated by reference herein.

FIELD OF THE INVENTION

This invention relates to transparent displays, and in a preferred set of examples to transparent autostereoscopic displays.

BACKGROUND OF THE INVENTION

Transparent displays enable a background behind the display to be viewed as well as the display output. The display thus has a certain level of transmittance. Transparent displays have many possible applications such as windows for buildings or automobiles and show windows for shopping malls. In addition to these large device applications, small devices such as hand held tablets may also benefit from transparent displays, for example to enable a user to view a map as well the scenery ahead though the screen.

It is expected that much of the existing display market will be replaced by transparent displays, for example in the fields of construction, advertisement and public information. Transparent displays are not yet available with 3D viewing capability, and in particular not yet using glasses-free autostereoscopic approaches, such as with lenticular lenses.

A transparent display typically has a display mode when the viewer is intended to view the display content, and a window mode when display is off and the viewer is intended to be able to see-through the display. A conventional combination of a lenticular lens on top of a display, as is common in autostereoscopic 3D displays, causes a problem if the display is transparent as the lenticular lens will cause a distorted view of the image behind the display. Thus, the window mode does not provide a proper view of the scene behind the window.

For 2D transparent displays, the optical performance of a transparent display can also be reduced by excessive light transmitted through the display whereby the contrast is poor.

SUMMARY OF THE INVENTION

The invention is defined by the claims.

According to one aspect of the invention, there is provided a display comprising a display panel, wherein the display panel has an array of light emitting display pixels occupying pixel areas with a light transmissive area between the pixel areas; and a polarizer associated only with the light transmissive area.

This arrangement provides a polarizer between the pixels, in the area which provides the transparency of the display. In the most basic implementation, this can be used to improve the contrast ratio of the display, and/or reduce glare for a transmissive function.

The pixels can be arranged to emit light in only one of the two opposite directions normal to the display panel. In this way, one side of the display provides a display output function (in combination with a see-through function) and the other side provides only the see-through function.

Instead, the pixels can be arranged to emit light in both opposite directions normal to the display panel, so that a display function can be provided on both sides of the panel. If the same set of pixels is used to emit light in both directions, then one viewed image will be a mirrored version of the other. Thus, the pixels can comprise a first set arranged to emit light in only one of the two directions normal to the display panel and a second set arranged to emit light in the opposite direction normal to the display panel. In this way, different images can be provided in the two opposite directions.

The polarizer preferably comprises an in-plane polarizer between the pixels, and it can for example comprise a wire grid polarizer.

The invention is of particular interest for an autostereoscopic display. The light emitting display pixels are then arranged to provide light of a first polarization which is orthogonal to a second polarization passed by the polarizer. An image forming arrangement is then provided for directing images from different sets of pixels in different lateral viewing directions thereby enabling autostereoscopic viewing, wherein the image forming arrangement is provided over one or both sides of the display.

In this way, light of the first polarization is used to form autostereoscopic images, whereas light of the second polarization is used for a look through function. No polarization switching is needed to implement this system.

The display pixels can each comprise a polarizer to block light of the second polarization. Thus, the pixel emitters can produce non-polarized light, which is then converted by the polarizer. The pixels can also have a reflector or absorber to block light being emitted in the unwanted one of the two normal directions.

One of the polarizations can be linear horizontal polarization and the other can be linear vertical polarization, or else one of the polarizations can be clockwise circular polarization and the other can be counter-clockwise circular polarization.

A first set of examples of 3D display uses a lenticular arrangement to provide the view forming function. In this case, the image forming arrangement comprises a birefringent lens structure which provides a lensing function for light of the first polarization and a pass through function for light of the second polarization.

The birefringent lens structure can be:

provided on one side only of the display and the display pixels are arranged to emit light in only one of the two directions normal to the display panel; or provided on both sides of the display and the display pixels comprise a first set arranged to emit light in only one of the two directions normal to the display panel and a second set arranged to emit light in the opposite direction normal to the display panel; or provided on one side of the display and the display pixels comprise a first set arranged to emit light in only one of the two directions normal to the display panel and a second set arranged to emit light in the opposite direction normal to the display panel.

This provides various possibilities, including a 3D display output on one side of the display or on both sides of the display, or a hybrid 3D display on one side and 2D display on the other side.

A second set of examples of 3D display uses a barrier arrangement to provide the autostereoscopic view forming function. In this case, the image forming arrangement comprises a barrier arrangement, comprising polarizing light barriers which provide a blocking function for light of the first polarization and a pass through function for light of the second polarization.

Again the barrier arrangement can be:

provided on one side only of the display and the display pixels are arranged to emit light in only one of the two directions normal to the display panel; or provided on both sides of the display and the display pixels comprise a first set arranged to emit light in only one of the two directions normal to the display panel and a second set arranged to emit light in the opposite direction normal to the display panel; or provided on one side of the display and the display pixels comprise a first set arranged to emit light in only one of the two directions normal to the display panel and a second set arranged to emit light in the opposite direction normal to the display panel.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a display having an array of light emitting display pixels occupying pixel areas, and a polarizing light transmissive area between the pixel areas.

The display panel can be used as the basis of a transparent autostereoscopic 3D display using parallax barriers or lenticular lenses to generate multiple views and the polariser prevents the barriers or lenses from causing an undesired distortion of light transmitted through the display. Alternatively, the panel can be used as the basis of a transparent 2D display whereby the polariser will create superior optical performance for example by reducing the transmission of polarised reflection from water or other surfaces.

In the case of the 3D design, the display enables an observer to properly see both 3D-content from the display and an undistorted view of the scenery behind the display, as well as a 2D view with improved contrast.

The invention makes use of a transparent emissive display panel, for example with OLED pixels or transparent OLED pixels. At least a substantial portion of the area between the emissive elements comprises a polariser, preferably a wire grid polariser. A wire grid polarizer is the simplest linear polarizer in concept, and consists of a regular array of fine parallel metallic wires, placed in a plane perpendicular to the incident beam. Electromagnetic waves which have a component of their electric fields aligned parallel to the wires induce the movement of electrons along the length of the wires and the wave is essentially reflected backwards along the incident beam. For waves with electric fields perpendicular to the wires, the electrons cannot move very far across the width of each wire; therefore, little energy is reflected, and the incident wave is able to pass through the grid. The separation distance between the wires must be less than the wavelength of the radiation, and the wire width should be a small fraction of this distance.

When used in the 3D implementation, the pixel emitters generate light of the orthogonal polarization to that passed by the polariser between the pixels.

The basic features of the display panel are first discussed, before separate embodiments in which the panel can be used.

Figure 1:
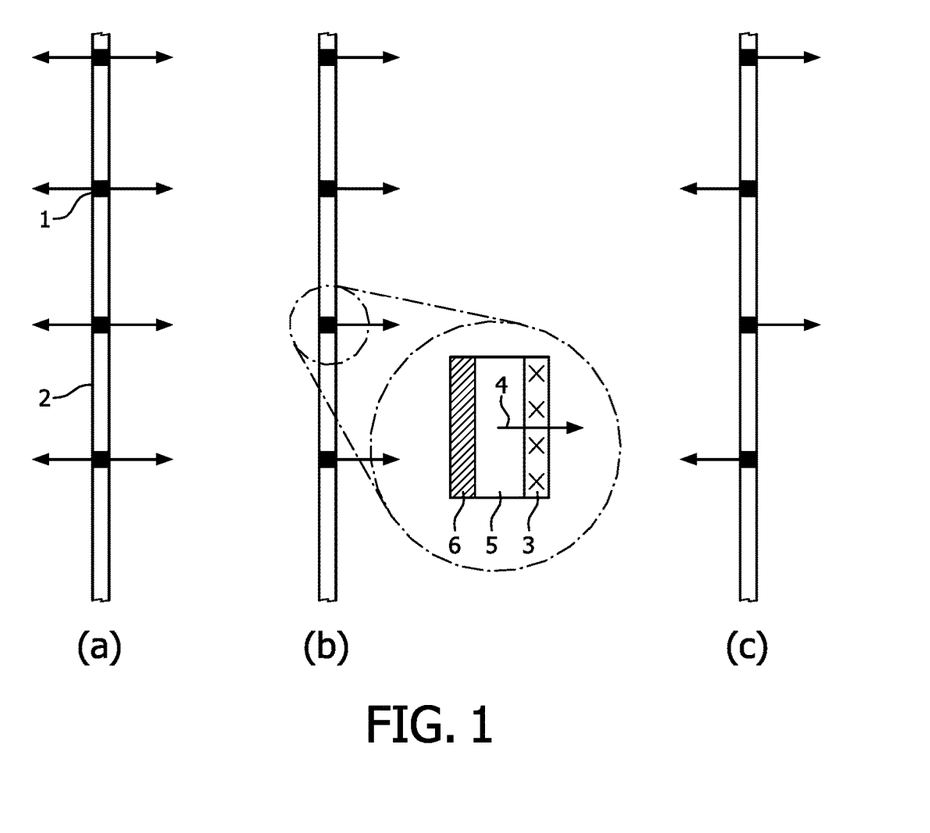
FIG. 1 shows three examples of display panel design for use in the display of the invention.

FIG. 1 shows the basic features of the transparent emissive display panel used in the various examples of display device of the invention.

The display panel comprises a plurality of emissive pixels 1, preferably OLED pixels, with light emission in either both directions as shown in FIG. 1(a), one direction as shown in FIG. 1(b) or alternating between the two directions as shown in FIG. 1(c). The directionality of the emission, as shown in FIGS. 1(b) and 1(c) can be imposed by adding a reflector behind the pixel emitter.

The pixels may be transparent OLED pixels, top emitting OLED pixels, or alternatively bottom emitting OLED pixels as are used in standard OLED display manufacturing at present.

The aperture ratio of the pixels is deliberately chosen to be considerably smaller than in a regular non-transparent display, typically less than 50% aperture.

At least a substantial portion of the area between the emissive elements comprises a polariser. This may for example be formed as a patterned polymer based polariser or, more preferably, a wire grid polariser 2. The polariser may be configured as a linear (in which case a wire grid polarizer can be used) or as a circular or elliptical polariser.

FIG. 1(b) shows in enlarged form the structure of a pixel which provides directional light emission. The pixel comprises a polarizer 3 (which is optional and depends on the display design) on the light output face of the pixel, the light emitting layer 5 and a reflector 6 at the back of the pixel stack. The emission direction is shown as arrow 4.

A first embodiment provides a single sided 2D transparent emissive display with in-plane polariser, and is based on the panel shown in FIG. 1(b).

The role of the polariser is to improve the contrast ratio of the display for a viewer on the right hand side of the display in the case that the light incident on the left hand side of the display to be transmitted by the display is polarised. This is the configuration shown in FIG. 1(b). A well-known cause of such polarisation is reflection of light by water, snow, ice or other reflective surfaces.

With a suitable choice of polariser, such as with crossed polarisation if the light is linearly polarised, it is possible to greatly reduce glare for example from reflected sunlight whilst still allowing a considerable transparency of the display.

As the reflection from a water surface for example has primarily polarised light parallel to the plane of the surface, then the display should preferably have a vertical polariser.

There is also the possibility to suppress not only polarized reflections, but also partially polarized skylight. This polarization depends on the position of the sun.

There is the possibility to add switchable polarization rotators between the pixels instead of fixed polarisers between the pixels. This enables the see-through function to be tuned to the prevailing lighting conditions.

A second example provides a double sided 2D transparent emissive display with in-plane polariser, based on the panel shown in FIG. 1(a) or FIG. 1(c). This display may be viewed from either one side, the other side or both sides simultaneously, depending upon which pixels are driven.

Assuming the panel of FIG. 1(a), the panel can be viewed from both sides, but on one side the image will be mirrored. Using the panel of FIG. 1(c), the image seen from either side can be driven independently at half of the resolution that is available in the panel from FIG. 1(a).

The role of the polariser is again to improve the contrast ratio of the display for a viewer on the right hand side of the display in the case that the light incident on the left hand side of the display to be transmitted by the display is polarised. This also works for a viewer on the left hand side of the display.

A third example provides a transparent double-sided autostereoscopic 3D display with-in-plane polariser.

Figure 2:
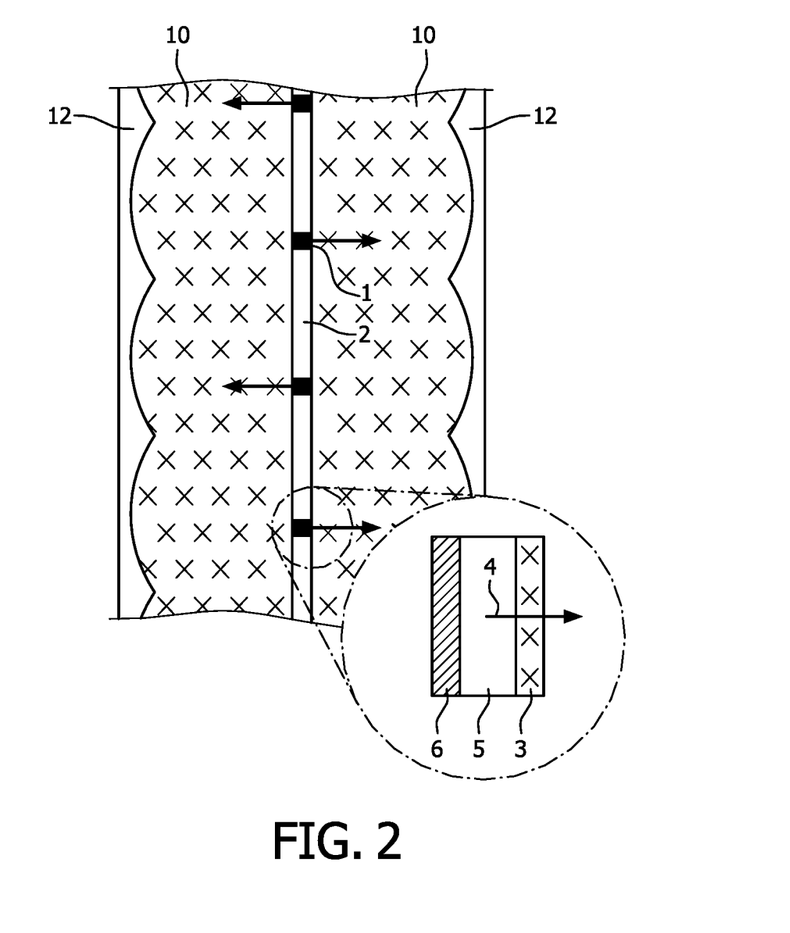
FIG. 2 shows a first example of autostereoscopic display device of the invention.

This example is shown in FIG. 2.

The pixel layout is based on that shown in FIG. 1(c), and with the same pixel structure as shown in FIG. 1(b) including the optional polarizer 3.

The display layer is covered on both sides with a lenticular lens arrangement comprising lenticular lenses 10 and replica layers 12. These define a lens surface at their interface. In an alternative arrangement, a parallax barrier could be used instead of the lenticular lens arrangement, and an example is given below.

In this example, observers standing on the left and right (i.e. on opposite sides of the display panel) can see both 3D content generated by the display and the scenery through the display undisturbed. A typical application could be an interactive shop window, a public information display, an interactive advertisement display, or a transparent computer screen.

For this purpose, light transmitted through the display should not be refracted by the lenticular lens (or blocked by the parallax barrier), while light emitted by the display should be refracted by the lenticular lens (or partially blocked by the parallax barrier) in order to be able to act as an autostereoscopic 3D display.

To achieve this aim, the lenticular lens 10 is made from a birefringent material (or the parallax barrier is made of polarizers). In this way, the lens (or the barrier) only affects one polarization state of the light, which will be named state A. The polarization state perpendicular to state A, which will be named state B, can propagate undisturbed through the lens or the barrier.

The light that will be transmitted through the display is polarized with an in-plane polarizer that transmits the polarization state B. The light generated by the display should be of polarization state A.

In this way, light emitted by the pixels is subjected to a lens function, whereas light transmitted through the display is limited to polarization state B by the polarizer, and this polarization state is not subjected to a lens function.

The pixels of the display should not completely block the transmitted light of polarization state B, and this is ensured by providing a suitable aspect ratio, such that light of polarization state B is transmitted in the spaces between the pixels.

Thus, by sandwiching the panel design of FIG. 1(c) between two birefringent lenticular lenses, the display enables undistorted viewing through the display as well as autostereoscopic display viewing. This is made possible without needing any switchable polarising elements.

As the display only transmits one polarization state, it will be understood that typically half of the ambient light is blocked thereby reducing the brightness when looking through the display.

This version requires control of the polarization states. The polarization state A is used to generate 3D-content and the orthogonal polarization state B is used to transmit any light undisturbed through the display. Two possible examples of these polarization states are:

Example 1:
state A=linearly horizontally polarized
state B=linearly vertically polarized
Example 2:
state A=clockwise circularly polarized
state B=counter-clockwise circularly polarized In FIG. 2, dashed crosses and dashed lines are used to indicate orthogonal polarization states for the various optical components. For the polarization transmitted through polarizer 3, the material of the lens has a different refractive index to the replica 12 and therefore acts as a lens for this polarization.

The dashed crosses indicate that the optical element works on polarization state A, which means:
For a polariser, it transmits state A and absorbs/reflects state B;
For a lens, state A effectively sees the birefringent lens and replica 10,12 as a lenticular lens, whereas state B effectively sees the birefringent lens and replica as a spacer.

The dashed lines indicate that the optical element works on polarization state B, which means:
For a polariser, it transmits state B and absorbs/reflects state A;
For a lens, state B effectively sees the birefringent lens and replica as a lenticular lens, whereas state A effectively sees the birefringent lens and replica as a spacer.

In the example of FIG. 2, the refractive index of the replica 12 should be equal to one of the refractive indices of the birefringent material of the lenticular 10. In this way, the combination of the lens and replica will act as a lenticular lens for one polarization state and as a normal spacer layer for the other polarization state.

The polarizer 3 on top of the pixels ensures that the emitted light has the required polarization.

It should be understood that, just as in other autostereoscopic displays, there are multiple variations possible on the way to implement the lenticular lens into the embodiment. Alternatives can be a stack with the curved lens surface on the outside, a solid stack with a flat outside, or any other lens stack. Thus, the design of the lenticular lens and the driving of the pixels should be similar as for a typical autostereoscopic display.

Figure 3:
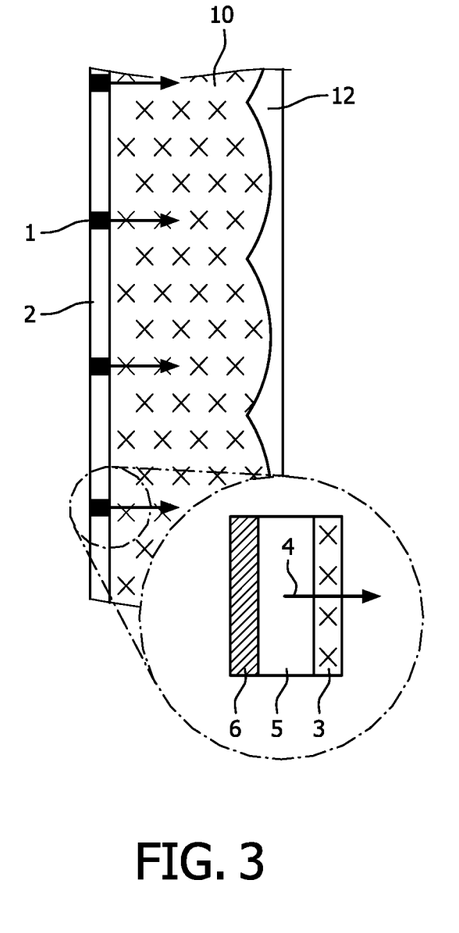
FIG. 3 shows a second example of autostereoscopic display device of the invention.

FIG. 3 shows a further example for a transparent single-sided autostereoscopic 3D display with in-plane polariser This example uses the panel design of FIG. 1(b) with a lenticular lens structure (as in FIG. 2) over one side only of the display.

Figure 4:
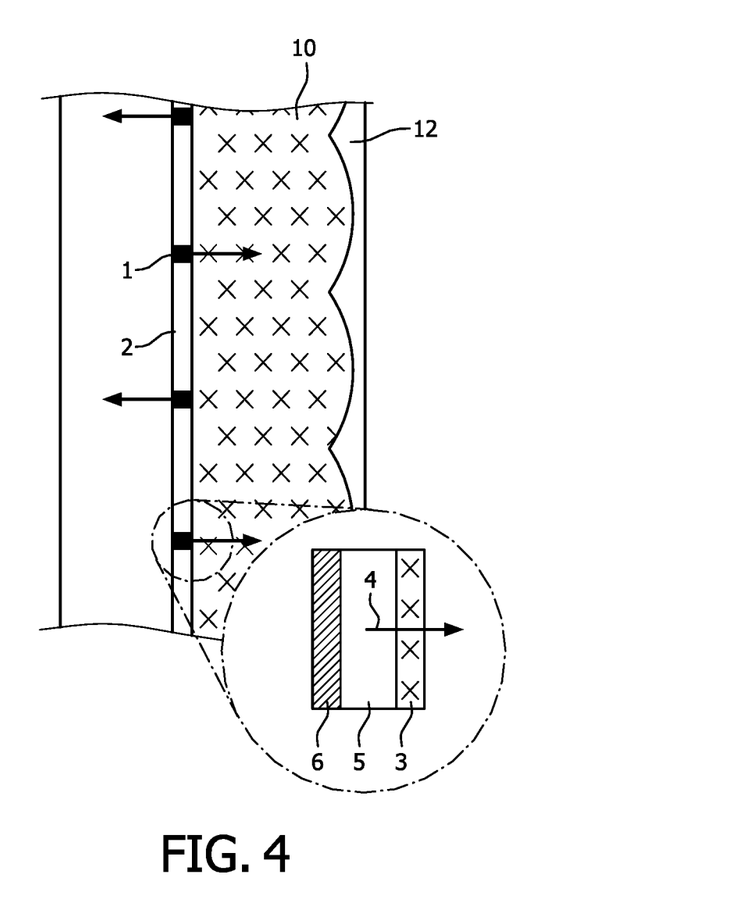
FIG. 4 shows a third example of autostereoscopic display device of the invention.

FIG. 4 shows a further example for a transparent hybrid 2D autostereoscopic 3D display with in-plane polariser.

This example uses the panel design of FIG. 1(c) and has a lens arrangement on one side of the display only to realise a single-sided transparent 3D autostereoscopic display. The other side of the display implements a 2D display such that a hybrid 2D/3D transparent display is realised.

The autostereoscopic examples above can be implemented with parallax barriers instead of lenticular lenses. For the best performance however, an ordinary parallax barrier would cause a disturbed view of the image transmitted through the display. Thus, the barriers are instead made of polarisers. The state of the polariser is chosen to be equal to the state of the in-plane polariser 2 of the display panel, so that light transmitted through the display can travel undisturbed to an observer, while for the content created by the pixels the observer sees them through a parallax barrier.

Figure 5:
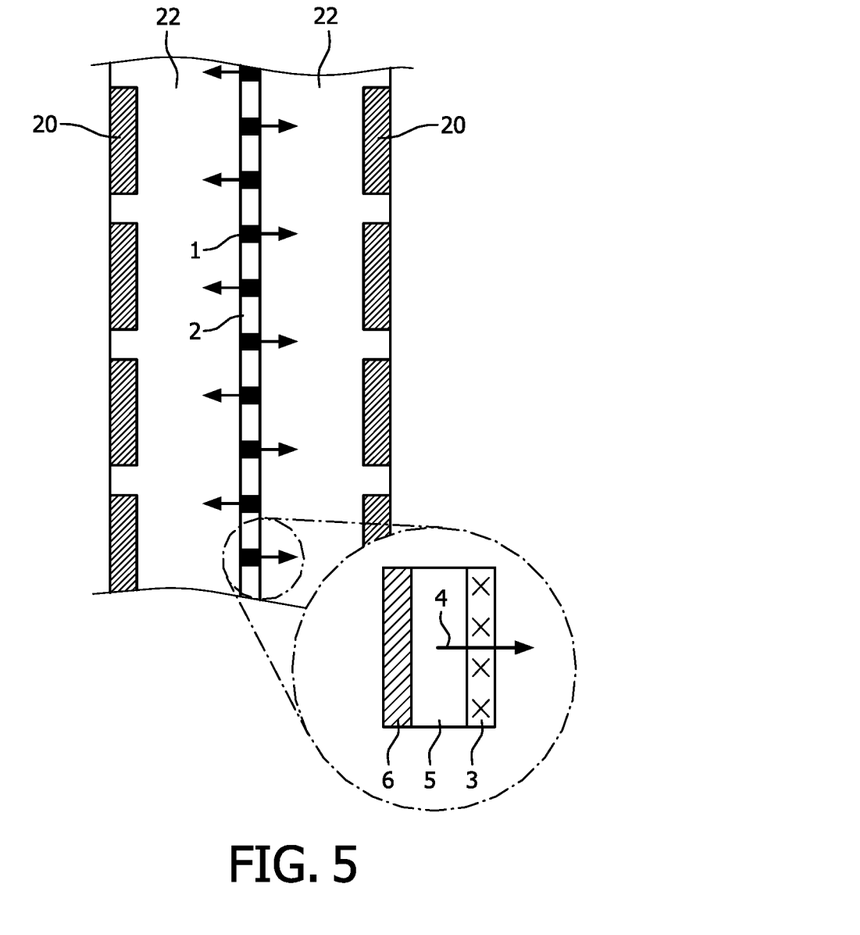
FIG. 5 shows a fourth example of autostereoscopic display device of the invention.

FIG. 5 shows one example based on the double sided arrangement of FIG. 2.

In FIG. 5, the two birefringent lens and replica arrangements of FIG. 2 are replaced with respective parallax barrier arrangements. Each parallax barrier arrangement consists of a polarizer 20 on top of a spacer 22. The polarizers 20 transmit the same polarization state as the polarizer 2 of the panel.

The same substitution of components can be made to the versions of FIGS. 3 and 4.

Although there are versions described above with 2D viewing only, the invention is of particular interest for transparent 3D displays such as interactive shop windows, public information displays, and an interactive 3D advertisement display.

As mentioned above, the space between pixels provides the transparency, so the pixels themselves do not need to be transparent. The pixels preferably occupy less than 50% of the display area, and more preferably less than 30% of the display area.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An autostereoscopic display comprising:
   a display panel having an array of light emitting display pixels occupying pixel areas, and a light transmissive area between the pixel areas, wherein the light emitting display pixels provide light of a first polarization;
   a polarizer, the polarizer having a second polarization, wherein the polarizer is disposed only upon the light transmissive area,
      wherein the light of the first polarization is orthogonal to the second polarization; and
   an image forming arrangement, wherein the image forming arrangement is arranged for directing images from different sets of pixels in different lateral viewing directions, wherein the image forming arrangement is provided over one side of the display,
   wherein the image forming arrangement is used to form autostereoscopic images using light of the first polarization,
   wherein light of the second polarization is used for a pass through transparent function.

2. The autostereoscopic display as claimed in claim 1, wherein the pixels are arranged to emit light in only one of the two directions normal to the display panel.

3. The autostereoscopic display as claimed in claim 1, wherein the pixels are arranged to emit light in any direction normal to the display panel.

4. The autostereoscopic display as claimed in claim 1, wherein the pixels comprise a first set of pixels arranged to emit light in a first direction normal to the display panel and a second set of pixels arranged to emit light in a second direction direction normal to the display panel,
wherein the first direction is opposite the second direction.

5. The autostereoscopic display as claimed in claim 1, wherein the polarizer comprises an in-plane polarizer between the pixels.

6. The autostereoscopic display as claimed in claim 5, wherein the polarizer comprises a wire grid polarizer.

7. The autostereoscopic display as claimed in claim 1, wherein each of the display pixels comprise a polarizer to block light of the second polarization.

8. The autostereoscopic display as claimed in claim 1, wherein one of the polarizations is linear horizontal polarization and the other is linear vertical polarization.

9. The autostereoscopic display as claimed in claim 1, wherein one of the polarizations is clockwise circular polarization and the other is counter-clockwise circular polarization.

10. The autostereoscopic display as claimed in claim 1,
   wherein the image forming arrangement comprises a birefringent lens structure,
   wherein the image forming arrangement is arranged to provide a lensing function for light of the first polarization and the pass through function for light of the second polarization.

11. The autostereoscopic display as claimed in claim 10,
   wherein the birefringent lens structure is provided on one side of the display,
   wherein the display pixels are arranged to emit light in only one of the two directions normal to the display panel.

12. The autostereoscopic display as claimed in claim 10,
   wherein the birefringent lens structure is provided on both sides of the display,
   wherein the display pixels comprise a first set of display pixels and a second set of display pixels,
   wherein the first set of display pixels are arranged to emit light in a first direction,
   wherein the first direction is one of the two directions normal to the display panel,
   wherein the second set of display pixels arranged to emit light in a second direction normal to the display panel,
   wherein the first direction is opposite the second direction.

13. The autostereoscopic display as claimed in claim 10,
   wherein the birefringent lens structure is provided on one side of the display,
   wherein the display pixels comprise a first set of display pixels and a second set of display pixels,
   wherein the first set of display pixels are arranged to emit light in a first direction,
   wherein the first direction is one of the two directions normal to the display panel,
   wherein the second set of display pixels arranged to emit light in a second direction normal to the display panel,
   wherein the first direction is opposite the second direction.

14. The autostereoscopic display as claimed in claim 1,
   wherein the image forming arrangement comprises a barrier arrangement,
   wherein the barrier arrangement comprises polarizing light barriers,
   wherein the polarizing light barriers provide a blocking function for light of the first polarization and the pass through function for light of the second polarization.

15. The autostereoscopic display as claimed in claim 14,
   wherein the barrier arrangement is provided on one side of the display, wherein the display pixels are arranged to emit light in one of the two directions normal to the display panel.

16. The autostereoscopic display as claimed in claim 14,
wherein the barrier arrangement is provided on both sides of the display,
wherein the display pixels comprise a first set of display pixels and a second set of display pixels,
wherein the first set of display pixels are arranged to emit light in a first direction,
wherein the first direction is one of the two directions normal to the display panel,
wherein the second set of display pixels arranged to emit light in a second direction normal to the display panel,
wherein the first direction is opposite the second direction.

17. The autostereoscopic display as claimed in claim 14,
wherein the barrier arrangement is provided on one side of the display,
wherein the display pixels comprise a first set of display pixels and a second set of display pixels,
wherein the first set of display pixels are arranged to emit light in a first direction,
wherein the first direction is one of the two directions normal to the display panel,
wherein the second set of display pixels arranged to emit light in a second direction normal to the display panel,
wherein the first direction is opposite the second direction.

18. An autostereoscopic display comprising:
a display panel having an array of light emitting display pixels occupying pixel areas, and a light transmissive area between the pixel areas, wherein the light emitting display pixels provide light of a first polarization;
a polarizer, the polarizer having a second polarization, wherein the polarizer is disposed only upon the light transmissive area,
wherein the light of the first polarization is orthogonal to the second polarization; and
an image forming arrangement, wherein the image forming arrangement is arranged for directing images from different sets of pixels in different lateral viewing directions, wherein the image forming arrangement is provided over one both sides of the display,
wherein the image forming arrangement is used to form autostereoscopic images using light of the first polarization,
wherein light of the second polarization is used for a pass through transparent function.

* * * * *